United States Patent
Chou et al.

(10) Patent No.: US 8,405,182 B2
(45) Date of Patent: Mar. 26, 2013

(54) BACK SIDE ILLUMINATED IMAGE SENSOR WITH IMPROVED STRESS IMMUNITY

(75) Inventors: Keng-Yu Chou, Kaohsiung (TW); Dun-Nian Yaung, Taipei (TW); Jen-Cheng Liu, Hsin-Chu (TW); Pao-Tung Cheng, Tainan Hsien (TW); Wen-De Wang, Minsyong Township, Chiayi County (TW); Chun-Chieh Chuang, Tainan (TW); Min-Feng Kao, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 38 days.

(21) Appl. No.: 13/099,092

(22) Filed: May 2, 2011

(65) Prior Publication Data

US 2012/0280348 A1 Nov. 8, 2012

(51) Int. Cl.
*H01L 27/146* (2006.01)
*H01L 31/18* (2006.01)

(52) U.S. Cl. ......... 257/435; 257/E31.121; 257/E27.133; 438/72

(58) Field of Classification Search .................. None
See application file for complete search history.

(56) References Cited

U.S. PATENT DOCUMENTS

| | | | |
|---|---|---|---|
| 7,592,644 B2* | 9/2009 | Suzuki et al. | 257/184 |
| 7,615,808 B2* | 11/2009 | Pain et al. | 257/228 |
| 8,053,856 B1* | 11/2011 | Tu et al. | 257/432 |
| 2008/0150057 A1* | 6/2008 | Lee et al. | 257/432 |
| 2008/0283726 A1* | 11/2008 | Uya et al. | 250/208.1 |
| 2009/0200626 A1* | 8/2009 | Qian et al. | 257/432 |
| 2010/0214457 A1* | 8/2010 | Sakai | 348/294 |
| 2010/0230729 A1* | 9/2010 | Ellis-Monaghan et al. | 257/228 |
| 2010/0330728 A1* | 12/2010 | McCarten et al. | 438/70 |

OTHER PUBLICATIONS

K. D. Mackenzie, D. J. Johnson, M. W. DeVre, R. J. Westerman, and B. H. Reelfs, "Stress control of Si-based PECVD dielectrics," Silicon Nitride and Silicon Dioxide Thin Insulating Films and Other Emerging Dielectrics VIII—Proceedings of the International Symposium, pp. 148, 2005.*
Saadaoui, M., D. Peyrou, H. Achkar, F. Pennec, L. Bouscayrol, B. Rousset, P. T. Boyer, E. Scheid, P. Pons, and R. Plana. "Plasma-enhanced Chemical Vapor Deposition of Silicon Oxynitride for Micromachined Millimeter-wave Devices." Journal of Micromechanics and Microengineering 18.3 (2008): 035032.*
Optical Parameters of Photoresist downloaded from the internet at URL <http://www.microchemicals.eu/technical_information/photoresists_optical_parameters.pdf> revised Jan. 27, 2010 retrieved on Jul. 15, 2012.*

* cited by examiner

*Primary Examiner* — Thomas L Dickey
*Assistant Examiner* — Joseph Schoenholtz
(74) *Attorney, Agent, or Firm* — Haynes and Boone, LLP

(57) ABSTRACT

Provided is an image sensor device. The image sensor device includes a substrate having a front side and a back side opposite the first side. The substrate has a pixel region and a periphery region. The image sensor device includes a plurality of radiation-sensing regions disposed in the pixel region of the substrate. Each of the radiation-sensing regions is operable to sense radiation projected toward the radiation-sensing region through the back side. The image sensor device includes a reference pixel disposed in the periphery region. The image sensor device includes an interconnect structure that is coupled to the front side of the substrate. The interconnect structure includes a plurality of interconnect layers. The image sensor device includes a film formed over the back side of the substrate. The film causes the substrate to experience a tensile stress. The image sensor device includes a radiation-blocking device disposed over the film.

20 Claims, 10 Drawing Sheets

BACK SIDE ILLUMINATED IMAGE SENSOR WITH IMPROVED STRESS IMMUNITY

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

A back side illuminated (BSI) image sensor device is one type of image sensor device. These BSI image sensor devices are operable to detect light projected from its backside. A BSI image sensor device has a relatively thin silicon substrate (e.g., a few microns thick) in which light-sensing pixels are formed. The thin nature of the silicon substrate makes the pixels more susceptible to variations in stress, which may be caused by various backend processes and different pattern designs. Stress on the silicon substrate may increase leakage current, and the variations in stress may make leakage current calculations more difficult.

Hence, while existing BSI image sensor devices have been generally adequate for their intended purposes, they have not been entirely satisfactory in every aspect.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
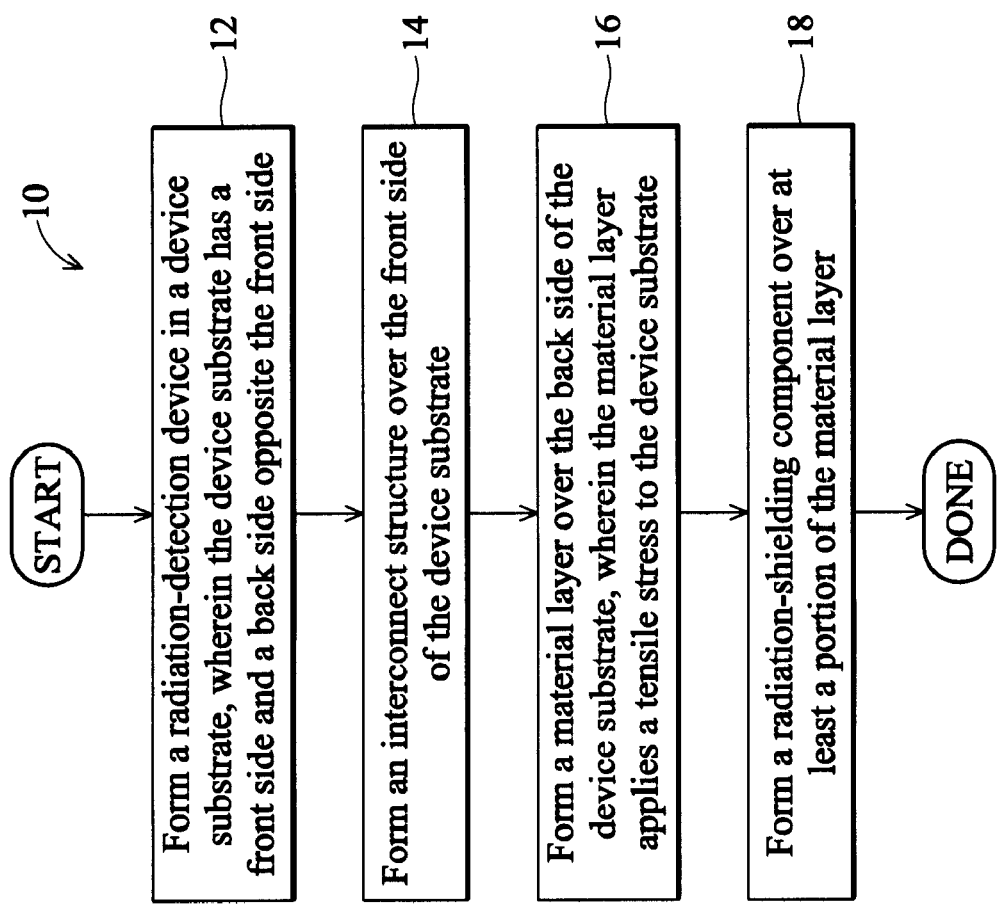
FIG. 1 is a flowchart illustrating a method for fabricating an image sensor device according to various aspects of the present disclosure.

Illustrated in FIG. 1 is a flowchart of a method 10 for fabricating a back-side illuminated (BSI) image sensor device according to various aspects of the present disclosure. Referring to FIG. 1, the method 10 begins with block 12 in which a radiation-detection device is formed in a device substrate. The device substrate has a front side and a back side opposite the front side. The radiation-detection device is operable to detect radiation waves that enter the device substrate through the back side. The method 10 continues with block 14 in which an interconnect structure is formed over the front side of the device substrate. The method 10 continues with block 16 in which a material layer is formed over the back side of the device substrate. The material layer applies a tensile stress to the device substrate. The method 10 continues with block 18 in which a radiation-shielding component is formed over at least a portion of the material layer.

FIGS. 2 to 6 are diagrammatic fragmentary sectional side views of various embodiments of an apparatus that is a BSI image sensor device 30 at various stages of fabrication according to aspects of the method 10 of FIG. 1. The image sensor device 30 includes an array or grid of pixels for sensing and recording an intensity of radiation (such as light) directed toward a back-side of the image sensor device 30. The image sensor device 30 may include a charge-coupled device (CCD), complimentary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 6 have been simplified for a better understanding of the inventive concepts of the present disclosure and may not be drawn to scale.

Figure 2:
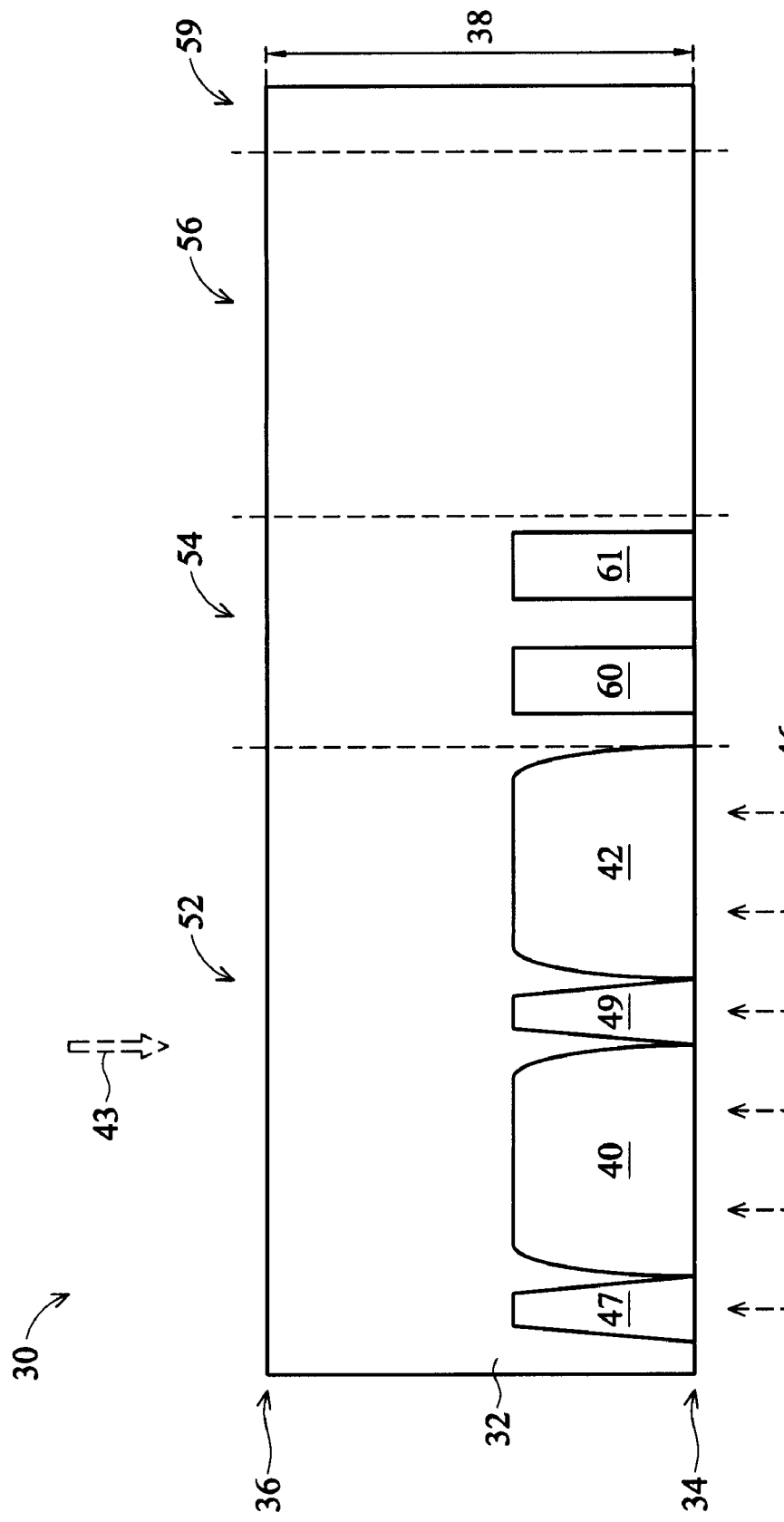
FIGS. 2-6 are diagrammatic fragmentary cross-sectional side views of an image sensor device at various stages of fabrication in accordance with various aspects of the present disclosure.

With reference to FIG. 2, the image sensor device 30 includes a device substrate 32. The device substrate 32 is a silicon substrate doped with a p-type dopant such as boron (for example a p-type substrate). Alternatively, the device substrate 32 could be another suitable semiconductor material. For example, the device substrate 32 may be a silicon substrate that is doped with an n-type dopant such as phosphorous or arsenic (an n-type substrate). The device substrate 32 could include other elementary semiconductors such as germanium and diamond. The device substrate 32 could optionally include a compound semiconductor and/or an alloy semiconductor. Further, the device substrate 32 could include an epitaxial layer (epi layer), may be strained for performance enhancement, and may include a silicon-on-insulator (SOI) structure. Referring back to FIG. 2, the device substrate 32 has a front side (also referred to as a front surface) 34 and a back side (also referred to as a back surface) 36. The device substrate 32 also has an initial thickness 38 that is in a range from about 100 microns (um) to about 3000 um. In the present embodiment, the initial thickness 38 is in a range from about 500 um to about 1000 um.

Radiation-sensing regions—for example, pixels 40 and 42—are formed in the device substrate 32. The pixels 40 and 42 are operable to sense radiation, such as an incident light 43, that is projected toward device substrate 32 from the back side 36. The pixels 40 and 42 each include a photodiode in the present embodiment. In other embodiments, the pixels 40 and 42 may include pinned layer photodiodes, photogates, reset transistors, source follower transistors, and transfer transistors. The pixels 40 and 42 may also be referred to as radiation-detection devices or light-sensors.

The pixels 40 and 42 may be varied from one another to have different junction depths, thicknesses, widths, and so forth. For the sake of simplicity, only two pixels 40 and 42 are illustrated in FIG. 2, but it is understood that any number of pixels may be implemented in the device substrate 32. In the embodiment shown, the pixels 40 and 42 are formed by performing an implantation process 46 on the device substrate 32 from the front side 34. The implantation process 46 includes doping the device substrate 32 with a p-type dopant such as boron. In an alternative embodiment, the implantation process 46 may include doping the device substrate 32 with an n-type dopant such as phosphorous or arsenic. In other embodiments, the pixels 40 and 42 may also be formed by a diffusion process.

Referring back to FIG. 2, the device substrate 32 includes isolation structures—for example, isolation structures 47 and 49—that provide electrical and optical isolation between the pixels 40 and 42. The isolation structures 47 and 49 include shallow trench isolation (STI) structures that are formed of a dielectric material such as silicon oxide or silicon nitride. The STI structures are formed by etching openings into the substrate 32 from the front side 34 and thereafter filling the openings with the dielectric material. In other embodiments, the isolation structures 47 and 49 may include doped isolation features, such as heavily doped n-type or p-type regions. It is understood that the isolation structures 47 and 49 are formed before the pixels 40 and 42 in the present embodiment. Also, for the sake of simplicity, only two isolation structures 47 and 49 are illustrated in FIG. 2, but it is understood that any number of isolation structures may be implemented in the device substrate 32 so that the radiation-sensing regions such as pixels 40 and 42 may be properly isolated from one another.

Still referring to FIG. 2, the pixels 40 and 42 and isolation structures 47 and 49 are formed in a region of the image sensor device 30 referred to as a pixel region 52. The image sensor 30 also includes a periphery region 54, a bonding pad region 56 (also referred to as a bond pad region), and a scribe line region 59. The dashed lines in FIG. 2 designate the approximate boundaries between the regions 52, 54, 56, and 59. The periphery region 54 includes devices 60 and 61 that need to be kept optically dark. For example, the device 60 in the present embodiment may be a digital device, such as an application-specific integrated circuit (ASIC) device or a system-on-chip (SOC) device. The device 61 may be a reference pixel that is used to establish a baseline of an intensity of light for the image sensor device 30.

The bonding pad region 56 includes a region where one or more bonding pads (not illustrated) of image sensor device 30 will be formed in a later processing stage, so that electrical connections between the image sensor device 30 and outside devices may be established. The scribe line region 59 includes a region that separates one semiconductor die (for example, a semiconductor die that includes the bonding pad region 56, the periphery region 54, and the pixel region 52) from an adjacent semiconductor die (not illustrated). The scribe line region 59 is cut therethrough in a later fabrication process to separate adjacent dies before the dies are packaged and sold as integrated circuit chips. The scribe line region 59 is cut in such a way that the semiconductor devices in each die are not damaged. It is also understood that these regions 52-59 extend vertically above and below the device substrate 32.

Figure 3:
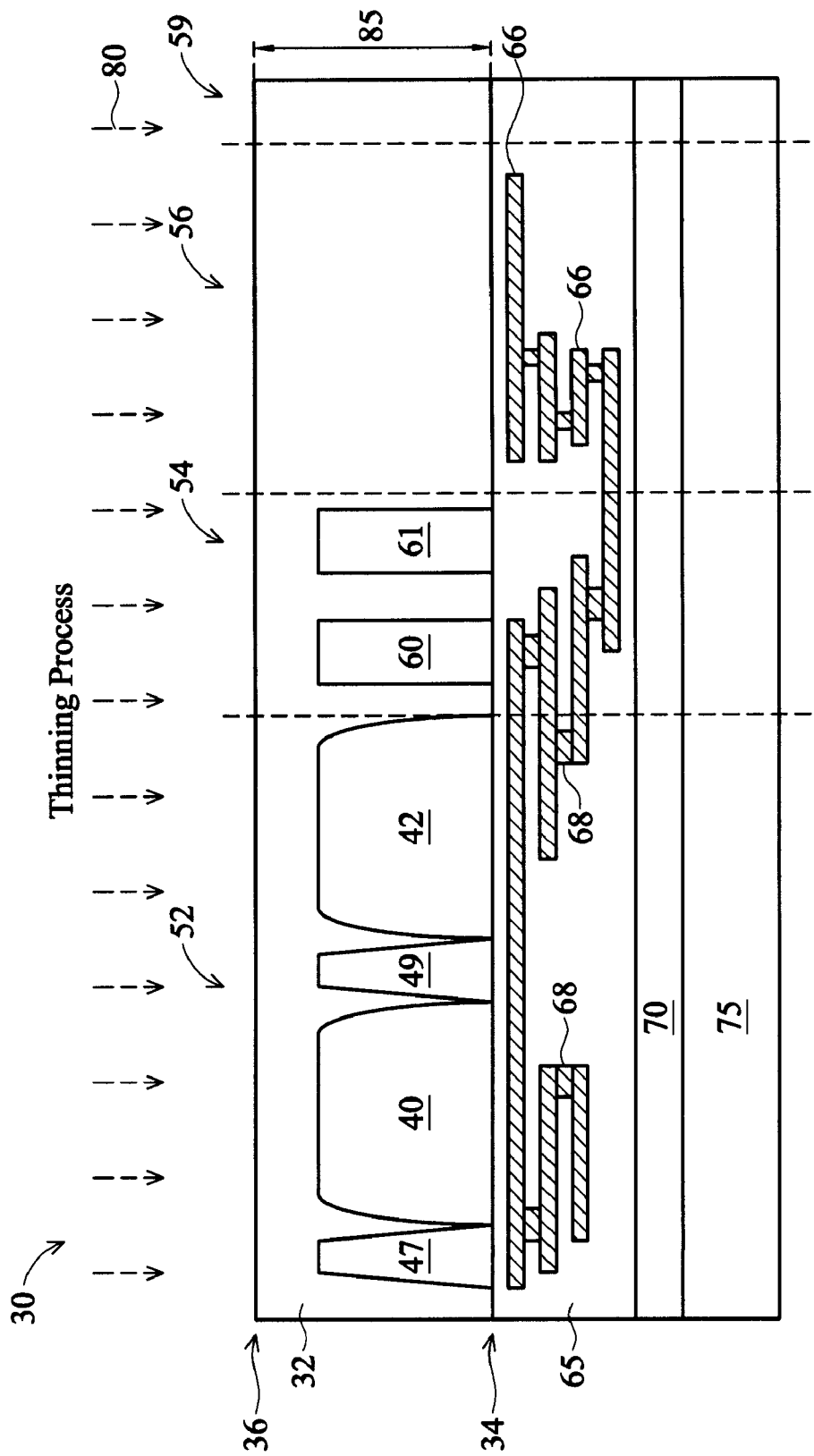

Referring now to FIG. 3, an interconnect structure 65 is formed over the front side 34 of the device substrate 32. The interconnect structure 65 includes a plurality of patterned dielectric layers and conductive layers that provide interconnections (e.g., wiring) between the various doped features, circuitry, and input/output of the image sensor device 30. The interconnect structure 65 includes an interlayer dielectric (ILD) and a multilayer interconnect (MLI) structure. The MLI structure includes contacts, vias and metal lines. For purposes of illustration, a plurality of conductive lines 66 and vias/contacts 68 are shown in FIG. 3, it being understood that the conductive lines 66 and vias/contacts 68 illustrated are merely exemplary, and the actual positioning and configuration of the conductive lines 66 and vias/contacts 68 may vary depending on design needs.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 68) and horizontal connection (for example, conductive lines 66). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 3, a buffer layer 70 is formed on the interconnect structure 65. In the present embodiment, the buffer layer 70 includes a dielectric material such as silicon oxide. Alternatively, the buffer layer 70 may optionally include silicon nitride. The buffer layer 70 is formed by CVD, PVD, or other suitable techniques. The buffer layer 70 is planarized to form a smooth surface by a chemical mechanical polishing (CMP) process.

Thereafter, a carrier substrate 75 is bonded with the device substrate 32 through the buffer layer 70, so that processing the back side 36 of the device substrate 32 can be performed. The carrier substrate 75 in the present embodiment is similar to the substrate 32 and includes a silicon material. Alternatively, the carrier substrate 75 may include a glass substrate or another suitable material. The carrier substrate 75 may be bonded to the device substrate 32 by molecular forces—a technique known as direct bonding or optical fusion bonding—or by other bonding techniques known in the art, such as metal diffusion or anodic bonding.

Referring back to FIG. 3, the buffer layer 70 provides electrical isolation between the device substrate 32 and the carrier substrate 75. The carrier substrate 75 provides protection for the various features formed on the front side 34 of the device substrate 32, such as the pixels 40 and 42. The carrier substrate 75 also provides mechanical strength and support for processing the back side 36 of the device substrate 32 as discussed below. After bonding, the device substrate 32 and the carrier substrate 75 may optionally be annealed to enhance bonding strength.

Still referring to FIG. 3, after the carrier substrate 75 is bonded, a thinning process 80 is then performed to thin the device substrate 32 from the backside 36. The thinning process 80 may include a mechanical grinding process and a chemical thinning process. A substantial amount of substrate material may be first removed from the device substrate 32 during the mechanical grinding process. Afterwards, the chemical thinning process may apply an etching chemical to the back side 36 of the device substrate 32 to further thin the device substrate 32 to a thickness 85, which is on the order of a few microns. In the present embodiment, the thickness 85 is less than about 5 um, for example about 2-3 um. In an embodiment, the thickness 85 is greater than at least about 1 um. It is also understood that the particular thicknesses disclosed in the present disclosure are mere examples and that other thicknesses may be implemented depending on the type of application and design requirements of the image sensor device 30.

Figure 4:
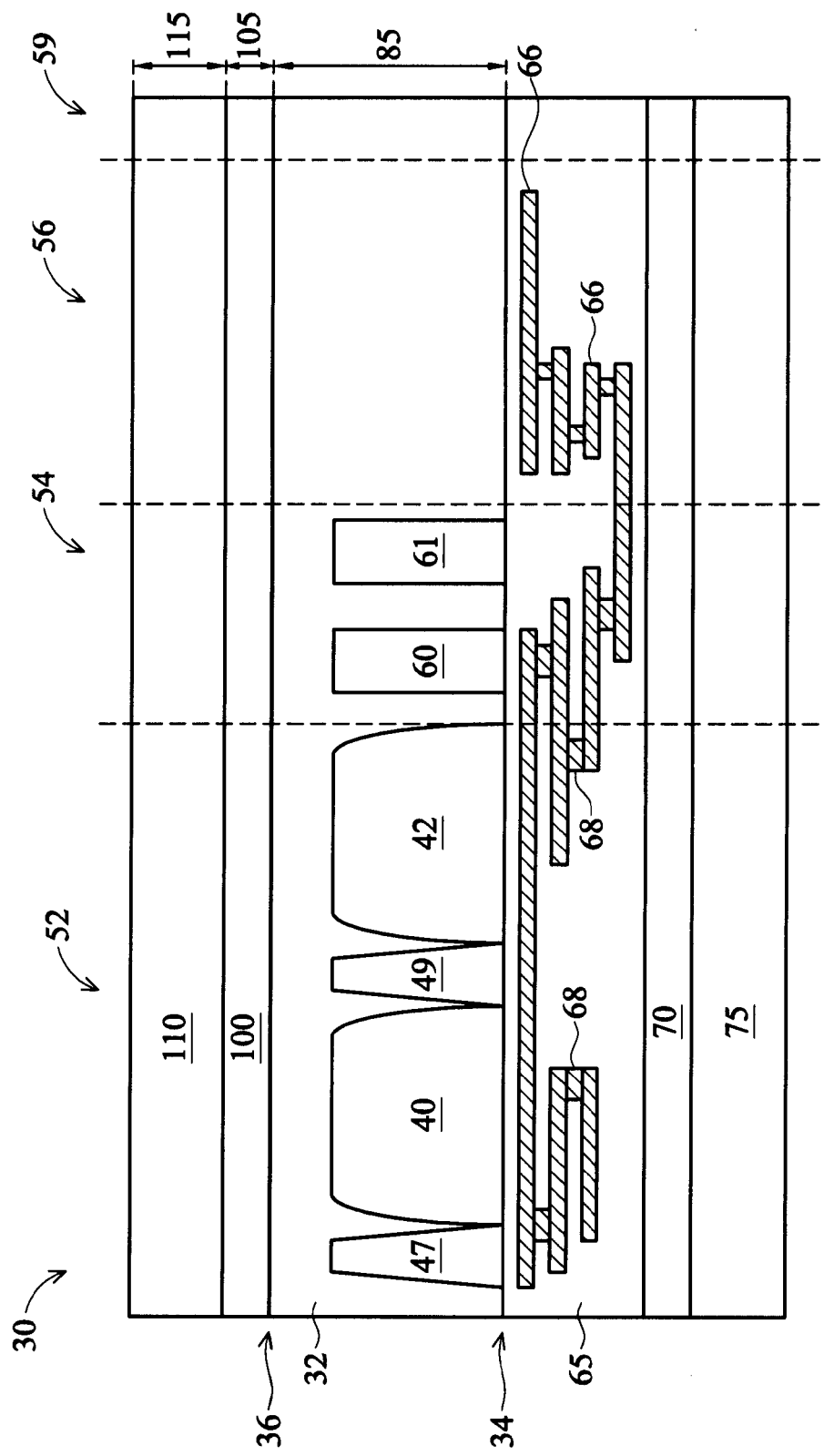

Referring now to FIG. 4, an anti-reflective coating (ARC) layer 100 is formed over the back side 36 of the device substrate 32. The ARC layer 100 may be formed by a suitable deposition process, such as CVD, PVD, ALD, or combinations thereof. The ARC layer 100 may include a suitable material for reducing a reflection of radiation waves projected toward the device substrate 32 from the back side 36. For example, the ARC layer 100 may contain silicon or nitrogen. The ARC layer has a thickness 105 that is in a range from about 100 Angstroms to about 3500 Angstroms.

Thereafter, a layer 110 is formed over the ARC layer 105. The layer 110 may be formed by a suitable deposition process, such as CVD, PVD, ALD, or combinations thereof. The layer 110 delivers a tensile stress to the layers below, including the thinned device substrate 32. Tensile stress is a type of stress on a material that leads to expansion, which means the length of the material tends to increase in the tensile direction. Conversely, a compressive stress is opposite of the tensile stress and is a type of stress on a material that leads to contraction, meaning the length of the material tends to decrease in the compressive direction. Here, the layer 110 delivers the tensile stress to the layers below, and as a result a compressive stress is applied to the layer 110 from the layers therebelow. As such, the layer 110 may also be referred to as a compressive layer/film or a compressively-stressed layer/film.

In an embodiment, the amount of tensile stressed delivered by the layer 110 is in a range from about 0.01 giga-pascals (GPa) to about 1.0 GPa. Thus, the layer 110 is a compressive film (its intrinsic stress is compressive relative to silicon), and it delivers a tensile stress to silicon. To ensure that the desired amount of tensile stress can be delivered, the layer 110 needs to have sufficient thickness. In an embodiment, the layer 110 has a thickness 115 that is in a range from about 100 Angstroms to about 3500 Angstroms, for example about 1200 Angstroms.

Also, since the BSI image sensor device 30 senses radiation waves projected from the back side 36, the layer 110 is in the path of the radiation. To avoid interference with the radiation detection, the material for the layer 110 is chosen to have a low absorption index (K) value and a suitable refractive index (N) value. In addition, to reduce unintended absorption of radiation, the layer 110 has an absorption index value that approaches (or is near) 0. In an embodiment, the absorption index value of the layer 110 is in a range from about 0 to about 0.2. To reduce unintended reflection and refraction of radiation, the layer 110 has a refractive index value that is calculated as follows: $N_{(layer\ 110)}$=square root of: $(N_{(layer\ below\ layer\ 110)} * N_{(layer\ above\ layer\ 110)})$. Stated differently, the refractive index value of the layer 110 is equal to the square root of the product of the refractive index value of a layer below the layer 110 and the refractive index value of a layer above the layer 110. In an embodiment, the refractive index value of the layer 110 is in a range from about 1.4 to about 2.5.

Several embodiments of the layer 110 are discussed below, along with their forming process. In one embodiment, a plasma-enhanced silicon nitride material is selected as the material for the layer 110. $SiH_4$, $NH_3$, and $N_2$ are used as forming gases in a forming process having a forming pressure between about 3 torr and about 10 torr, and a forming temperature between about 350 degrees Celsius and about 400 degrees Celsius. As a result, the layer 110 in this embodiment has an absorption index value of about 0, and a refractive index value between about 1.9 and 2. The layer 110 in this embodiment can deliver a tensile stress between about 0.2 GPa and about 0.3 GPa.

In another embodiment, a plasma-enhanced oxide material is selected as the material for the layer 110. $SiH_4$ and $N_2O$ are used as forming gases in a forming process having a forming pressure between about 3 torr and about 10 ton, and a forming temperature between about 350 degrees Celsius and about 400 degrees Celsius. As a result, the layer 110 in this embodiment has an absorption index value of about 0, and a refractive index value between about 1.46 and 1.5. The layer 110 in this embodiment can deliver a tensile stress between about 0.01 GPa and about 0.1 GPa.

In yet another embodiment, a silicon carbide material is selected as the material for the layer 110. $Si(CH_3)_4$ is used as forming gases in a forming process having a forming pressure between about 3 ton and about 10 torr, and a forming temperature between about 350 degrees Celsius and about 400 degrees Celsius. As a result, the layer 110 in this embodiment has an absorption index value of about 0, and a refractive index value of about 2.3. The layer 110 in this embodiment can deliver a tensile stress of about 0.7 GPa.

In one more embodiment, a plasma-enhanced silicon oxynitride material is selected as the material for the layer 110. $SiH_4$, $N_2$, and $N_2O$ are used as forming gases in a forming process having a forming pressure between about 3 torr and about 10 torr, and a forming temperature between about 350 degrees Celsius and about 400 degrees Celsius. As a result, the layer 110 in this embodiment has an absorption index value of about 0.2, and a refractive index value of about 2. The layer 110 in this embodiment can deliver a tensile stress between about 0.01 GPa and about 0.1 GPa.

It is also understood that although the layer 110 and the ARC layer 100 are illustrated as separate layers in the embodiment shown in FIG. 4, these layers may be integrated into a single layer in alternative embodiments. In other words, the material composition for the ARC layer 100 may be selected in a manner such that the ARC layer 100 has a low absorption index value, a suitable refractive index value, and can deliver a sufficient amount of tensile stress to the device substrate 32.

Regardless of the particular embodiment, the tensile stress delivered by the layer 110 to the device substrate 32 will help offset compressive stress delivered by additional layer(s) in subsequent fabrication processes, which will help reduce leakage current, as discussed in more detail below.

Figure 5:
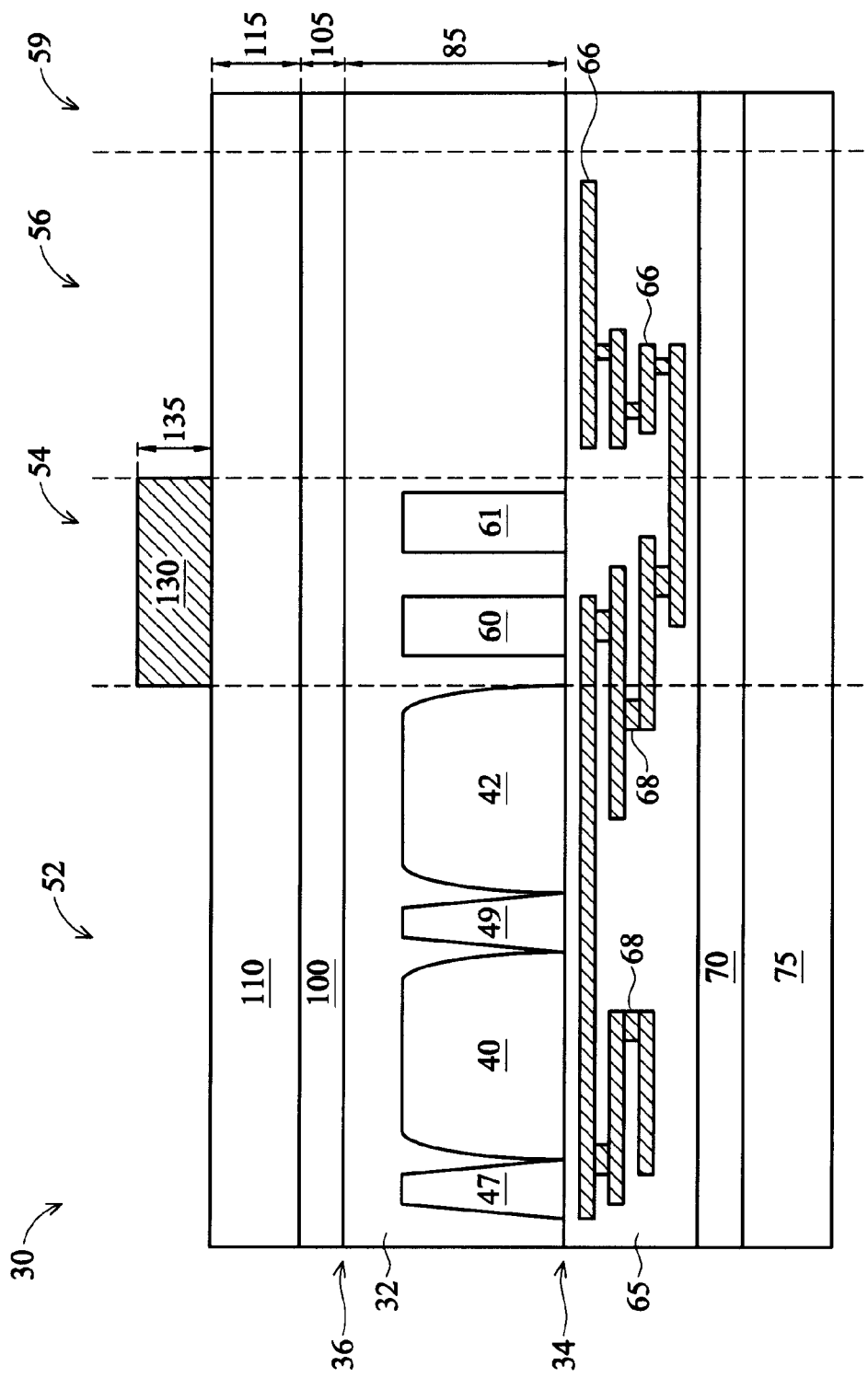

Referring now to FIG. 5, a radiation-shielding (or radiation-blocking) device 130 is formed in the periphery region 54 and over the layer 110. As discussed previously, the periphery region 54 needs to be kept optically dark. One reason is that the periphery region may contain a reference pixel (such as the reference pixel 61) that should not receive radiation so that it can establish an accurate baseline for the intensity of radiation for pixels in the pixel region 52. Thus, the radiation-shielding device 130 is located over the devices 60-61 below and includes a material that is substantially impenetrable by radiation. In the embodiment shown in FIG. 5, the radiation-shielding device 130 is aligned with the devices 60-61 and includes a metal material, for example AlCu. In other embodiments, the radiation-shielding device 130 may include other types of materials that can block radiation. The radiation-shielding device 130 has a thickness 135 that is in a range from about 1000 Angstroms to about 5000 Angstroms.

The radiation-shielding device 130 itself experiences a tensile stress, which means the radiation-shielding device 130 applies a compressive stress to the layers thereblow. Had the layer 110 not been implemented, the radiation-shielding device 130 would deliver a relatively high compressive stress to the device substrate 32. This compressive stress would cause the device substrate to have a shortened (narrower) bandgap. The shortened bandgap means that carriers such as electrons in a pixel can more easily jump from a valence band to a conduction band, thereby causing leakage current. If such leakage current results in an optically dark environment, the leakage current may be referred to as a dark current. For a conventional BSI image sensor device, the compressive stress caused by a light-shielding component means that the bandgap in the pixel region is different from the bandgap in the periphery region. Therefore, a reference pixel in the periphery region may have a greater amount of leakage current than sensor pixels in the pixel region. This leakage current discrepancy would lead to inaccurate baseline radiation intensity calculations, thereby degrading the performance of the conventional BSI image sensor device.

In comparison, the BSI image sensor device 30 herein utilizes the layer 110 to deliver a tensile stress to offset the compressive stress caused by the radiation-shielding device 130. As discussed above, tensile stress is opposite from compressive stress and makes the bandgap wider. Consequently, the compressive stress caused by the radiation-shielding device 130 is substantially offset or reduced by the tensile stress delivered by the layer 110. Therefore, the BSI image sensor device 30 has reduced leakage current and allows for more accurate baseline radiation intensity calculations.

Figure 6:
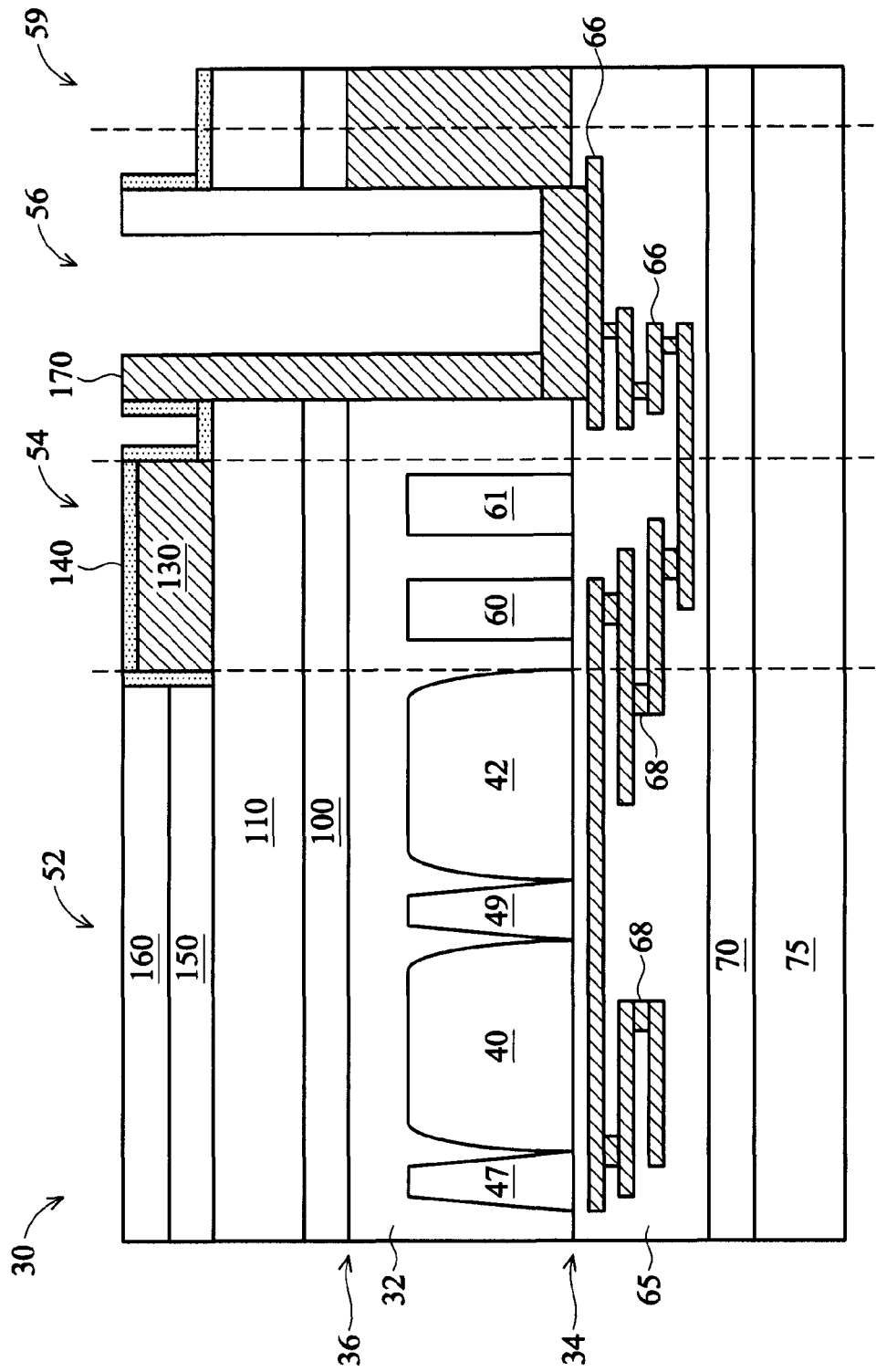

Referring now to FIG. 6, additional processes may be performed to finish fabrication of the BSI image sensor device 30. For example, a passivation layer 140 may be formed over the radiation-shielding device 130. The passivation layer 140 may include a material that has good sealing properties to prevent moisture, dust, or other contaminants from getting inside the BSI image sensor device 30. In an embodiment, the passivation layer 140 may include a silicon nitride material, for example ultra-violet silicon nitride (UVSN). But the passivation layer 140 may not be formed over the layer 110 because of radiation absorption. So the layer 110 can be treated as passivation layer and provide good sealing properties. In the following process, the color filter layer 150 is formed above the layer 110, and the ARC layer 100 is formed below the layer 110, the refractive index value of the layer 110 is calculated as being equal to a square root of a product of: the refractive index value of the ARC layer 100 and the refractive index value of the color filter layer 150. Thus, the refractive index value of the layer 110 is a function of the refractive index value of the ARC layer 100. The refractive index value of the layer 110 is also a function off the refractive index value of the color filter 150.

A color filter layer 150 may be formed in the pixel region 52. The color filter layer 150 may contain a plurality of color filters that may be positioned such that the incoming radiation is directed thereon and therethrough. The color filters may include a dye-based (or pigment based) polymer or resin for filtering a specific wavelength band of the incoming radiation, which corresponds to a color spectrum (e.g., red, green, and blue). Thereafter, a micro-lens layer 160 containing a plurality of micro-lenses is formed over the color filter layer 150. The micro-lenses direct and focus the incoming radiation toward specific radiation-sensing regions in the device substrate 32, such as pixels 40 and 42. The micro-lenses may be positioned in various arrangements and have various shapes depending on a refractive index of material used for the micro-lens and distance from a sensor surface. It is also understood that the device substrate 32 may also undergo an optional laser annealing process before the forming of the color filter layer 150 or the micro-lens layer 160.

In addition, a bonding pad 170 is formed in the bonding pad region 56. The bonding pad 170 is formed by etching an opening in the bonding pad region 56 and at least partially filling the opening with a conductive material. The conductive material may include a metal or metal compound, such as AlCu. The bonding pad 170 is electrically coupled to the interconnect structure 65, for example coupled to one of the conductive lines 66. Through the bonding pad 170, electrical connections may be established between the BSI image sensor device 30 and external devices.

It is understood that the sequence of the fabrication processes described above is not intended to be limiting. Some of the layers or devices may be formed according to different processing sequences in other embodiments than what is shown herein. For example, the bonding pad 170 and the radiation-shielding device 130 may be formed using the same fabrication process. Furthermore, some other layers may be formed but are not illustrated herein for the sake of simplicity. For example, one or more dielectric layers may be formed over the layer 110 and/or below the radiation-shielding device 130.

The embodiments of the present disclosure offer advantages over conventional BSI image sensors, it being understood that other embodiments may offer different advantages, and that no particular advantage is required for any embodiment. One advantage is that the layer 110 offsets the compressive stress that would otherwise be applied to the device substrate 32, since the layer 110 delivers a tensile stress to the device substrate 32. In other words, the device substrate 32 is more immune to compressive stress. In this manner, leakage current can be reduced, and radiation intensity calculations can be performed more accurately.

Another advantage is that the forming of the layer 110 is compatible with existing BSI image sensor process flow. The layer 110 may be formed using a processing chamber that is currently-available on a production line. Also, the absorption index value and the refractive index value of the layer 110 are tuned to be in suitable ranges so as to not interfere with radiation detection.

Figure 7A:
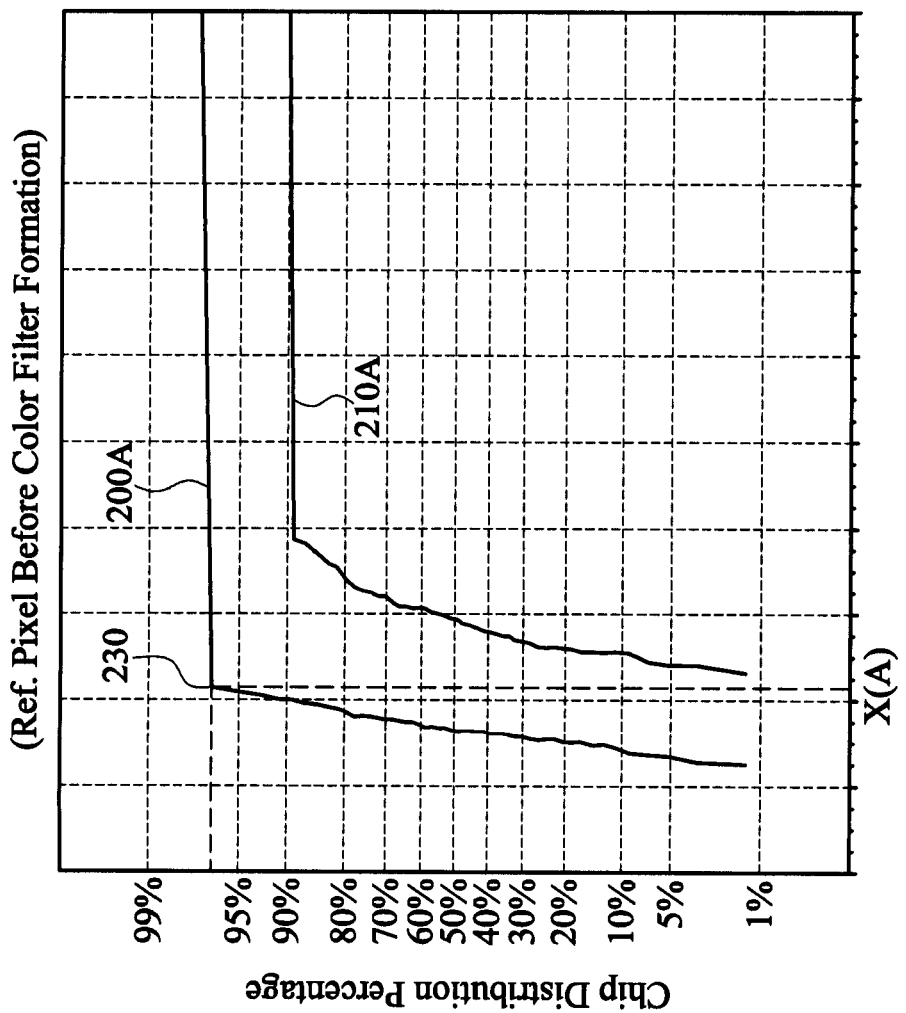
FIGS. 7A-7D are charts illustrating dark current performances of an image sensor device of the present disclosure versus a conventional image sensor device.
Figure 7B:
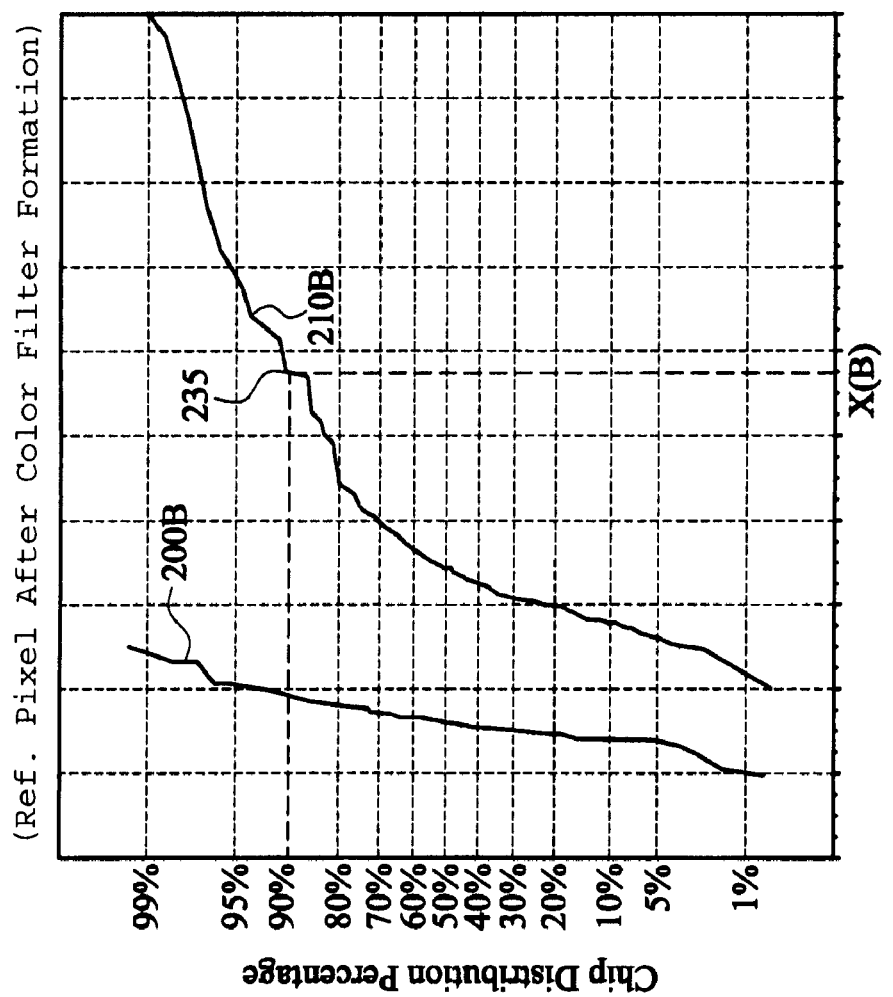
Figure 7C:
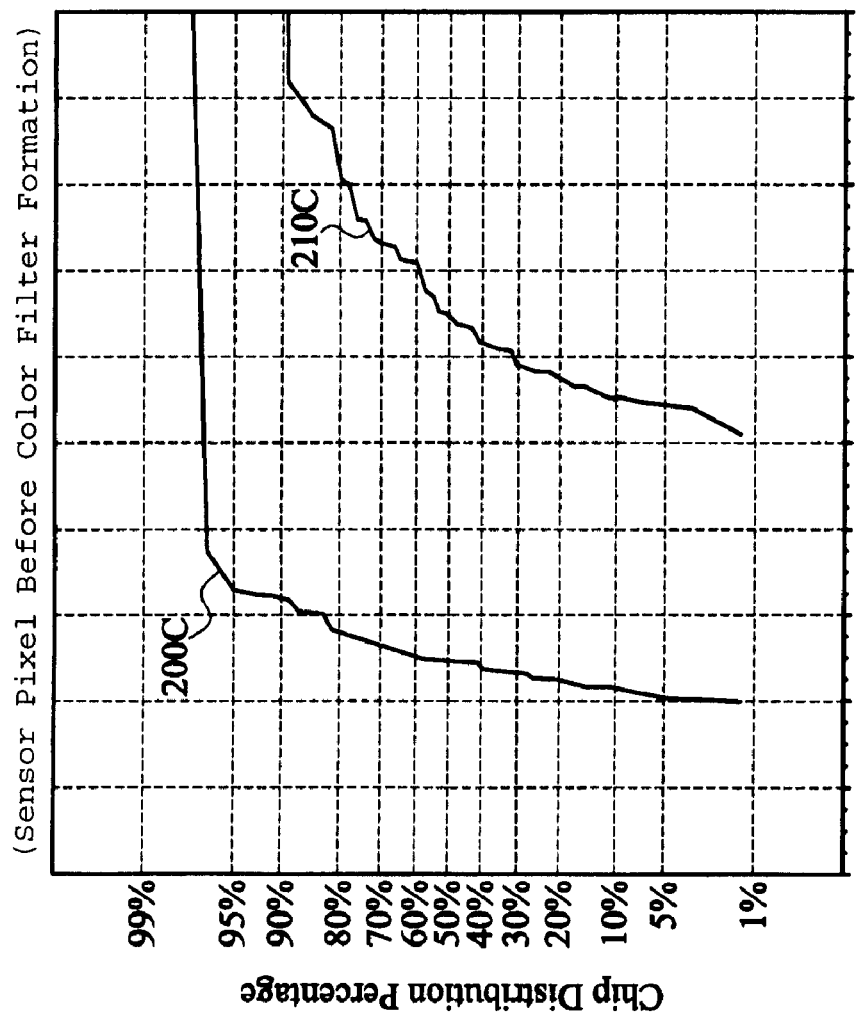

FIGS. 7A, 7B, 7C, and 7D are charts showing the improvement offered by an embodiment of the present disclosure versus a conventional BSI image sensor device, where each figure corresponds to a different situation. Specifically, FIG. 7A corresponds to a reference pixel dark current performance before the color filter layer is formed; FIG. 7B corresponds to a reference pixel dark current performance after the color filter layer is formed; FIG. 7C corresponds to a sensor pixel dark current performance before the color filter layer is formed; and FIG. 7D corresponds to a sensor pixel dark current performance after the color filter layer is formed.

Figure 7D:
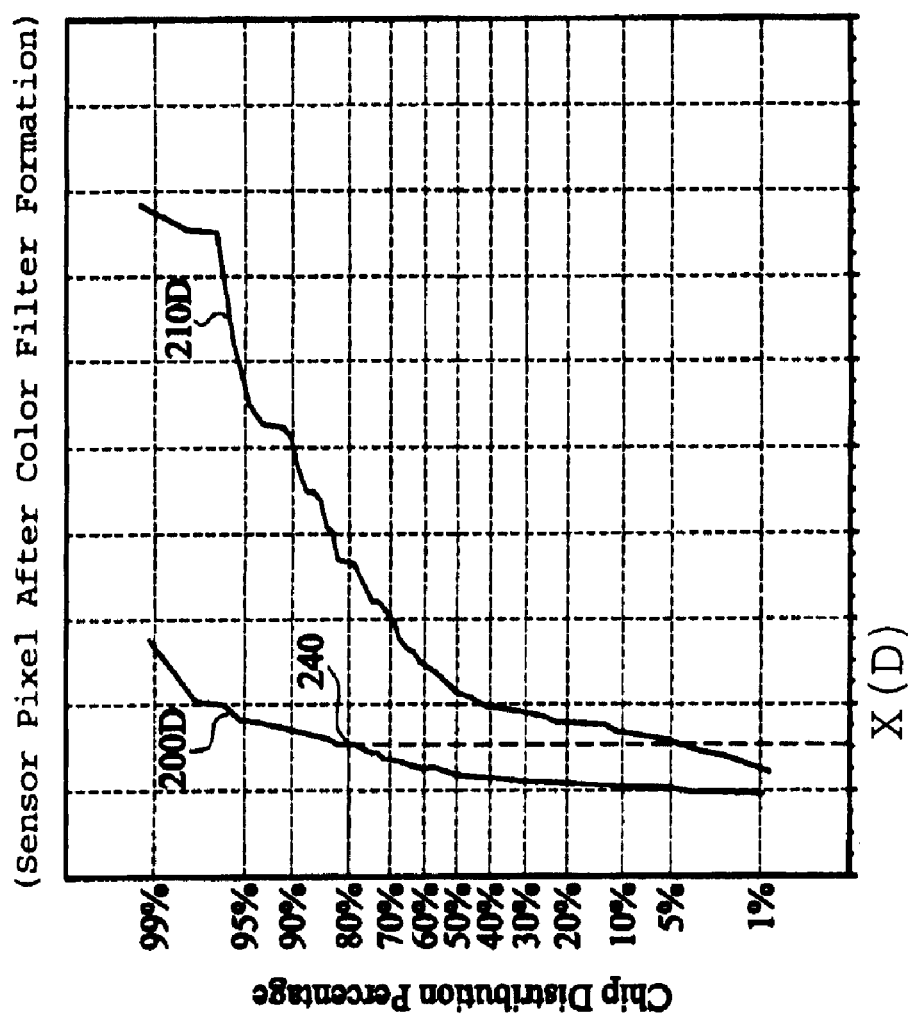

FIG. 7A shows two plot curves 200A and 210A, FIG. 7B shows two plots curves 200B and 210B, FIG. 7C shows two plot curves 200C and 210C, and FIG. 7D shows two plots curves 200D and 210D. The plot curves 200A-200D represent the dark current performance of a BSI image sensor device fabricated according to embodiments of the present disclosure, and the plot curves 210A-210D represent the dark current performance of a conventional BSI image sensor device. In each of the figures, the X-axis measures dark current (leakage current) with a unit of electrons/second, and the Y-axis measures a percentage of chip distribution. Thus, a given point on a plot curve indicates the percentage distribution of chips (BSI image sensor devices) meeting a specific dark current threshold or under a specific dark current limit.

As an example, refer to point 230 on the plot curve 200A in FIG. 7A, its X-axis value is X(A), and its Y-axis value is approximately 96%. This means that, for a BSI image sensor fabricated according to an embodiment of the present disclosure, before the color filters are formed, about 96% of the chips will include reference pixels having a dark current level that is less or equal to about X(A). As another example, refer to point 235 on the plot curve 210B in FIG. 7B, its X-axis value is X(B), and its Y-axis value is approximately 90%. This means that, for a conventional BSI image sensor, after the color filters are formed, about 90% of the chips will include reference pixels having a dark current level that is less or equal to X(B). As yet another example, refer to point 240 on the plot curve 200D in FIG. 7D, its X-axis value is approximately X(D), and its Y-axis value is approximately 80%. This means that, for a BSI image sensor fabricated according to an embodiment of the present disclosure, after the color filters are formed, about 80% of the chips will include sensor pixels having a dark current level that is less or equal to about X(D).

Regardless of the specific values associated with each plot curve, it can be seen that the plot curves 200A-200D have better dark current performance than the plot curves 210A-210D in the corresponding figures. In other words, regardless of whether the processing stage is before or after the color filter layer formation stage, and regardless of whether it is the reference pixel or the sensor pixel, the BSI image sensor fabricated according to embodiments of the present disclosure will have better dark current performance than a conventional BSI image sensor. Specifically, the BSI image sensor fabricated according to embodiments of the present disclosure will have a higher percentage of chips meeting a given dark current threshold (whatever that threshold may be) than a conventional BSI image sensor.

One of the broader forms of the present disclosure involves an image sensor device that includes: a substrate having a front surface and a back surface opposite the front surface; a radiation-sensing region disposed in the substrate, the radiation-sensing region being operable to detect radiation waves that enter the substrate through the back surface; an interconnect structure disposed over the front surface of the substrate; a material layer disposed over the back surface of the substrate, wherein the material layer delivers a tensile stress to the substrate; and a radiation-shielding device disposed over at least a portion of the material layer.

Another one of the broader forms of the present disclosure involves an image sensor device that includes: a substrate having a front side and a back side opposite the first side, the substrate having a pixel region and a periphery region; a plurality of radiation-sensing regions disposed in the pixel region of the substrate, each of the radiation-sensing regions being operable to sense radiation projected toward the radiation-sensing region through the back side; a reference pixel disposed in the periphery region; an interconnect structure that is coupled to the front side of the substrate, the interconnect structure including a plurality of interconnect layers; a compressively-stressed film formed over the back side of the substrate, the film causing the substrate to experience a tensile stress; and a radiation-blocking device disposed over the film and aligned with the reference pixel.

Still another of the broader forms of the present disclosure involves a method of fabricating an image sensor device, the method includes: forming a radiation-detection device in a device substrate, wherein the device substrate has a front side and a back side opposite the front side, and wherein the radiation-detection device is operable to detect radiation waves that enter the device substrate through the back side; forming an interconnect structure over the front side of the device substrate; forming a material layer over the back side of the device substrate, wherein the material layer applies a tensile stress to the device substrate; and forming a radiation-shielding component over at least a portion of the material layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor device, comprising:
   a substrate having a front surface and a back surface opposite the front surface;
   a radiation-sensing region disposed in the substrate, the radiation-sensing region being operable to detect radiation waves that enter the substrate through the back surface;
   an interconnect structure disposed over the front surface of the substrate;
   a material layer disposed over the back surface of the substrate, wherein the material layer delivers a tensile stress to the substrate;
   a passivation layer disposed over the material layer such that a portion the material layer directly over the radiation-sensing region is uncovered by the passivation layer; and
   a radiation-shielding device disposed over at least a portion of the material layer.

2. The image sensor device of claim 1, wherein the tensile stress is in a range from about 0.01 giga-pascal to about 1 giga-pascal.

3. The image sensor device of claim 1, wherein the material layer includes a plasma-enhanced silicon nitride material.

4. The image sensor device of claim 1, further including:
   an anti-reflective coating (ARC) layer disposed between the material layer and the substrate; and
   wherein the passivation layer and the ARC layer are disposed on opposite sides of the material layer.

5. The image sensor device of claim 4, wherein the material layer has a first refractive index value that is a function of a second refractive index value of the ARC layer.

6. The image sensor device of claim 1, wherein:
   the image sensor device includes a pixel region and a periphery region;
   the radiation-sensing region is disposed in the pixel region; and
   the radiation-shielding device is disposed in the periphery region.

7. The image sensor device of claim 6, further including a reference pixel disposed in the periphery region, wherein the radiation-shielding device substantially prevents the radiation waves from reaching the reference pixel.

8. An image sensor device, comprising:
   a substrate having a front side and a back side opposite the first side, the substrate having a pixel region and a periphery region;
   a plurality of radiation-sensing, regions disposed in the pixel region of the substrate, each of the radiation-sensing regions being operable to sense radiation projected toward the radiation-sensing region through the back side;

a reference pixel disposed in the periphery region;

an interconnect structure that is coupled to the front side of the substrate, the interconnect structure including a plurality of interconnect layers;

a film formed over the back side of the substrate, the film causing the substrate to experience a tensile stress;

a passivation layer formed over the film such that a portion the film directly over the plurality of radiation-sensing regions is uncovered by the passivation layer; and a radiation-blocking device disposed over the film and aligned with the reference pixel.

9. The image sensor device of claim 8, wherein the film includes a material that is selected from the group consisting of: plasma-enhanced silicon nitride, plasma-enhanced oxide, silicon carbide, and plasma-enhanced silicon oxynitride.

10. A method of fabricating an image sensor device, comprising:

forming a radiation-detection device in a device substrate, wherein the device substrate has a front side and a back side opposite the front side, and wherein the radiation-detection device is operable to detect radiation waves that enter the device substrate through the back side;

forming an interconnect structure over the front side of the device substrate;

forming a material layer over the back side of the device substrate, wherein the material layer applies a tensile stress to the device substrate;

forming a passivation layer over the material layer such that a portion the material layer directly over the radiation-detection device is uncovered by the passivation layer;

forming a radiation-shielding component over at least a portion of the material layer.

11. The method of claim 10, wherein the forming the material layer is carried out in a manner so that the tensile stress is in a range from about 0.01 giga-pascal to about 1 giga-pascal.

12. The method of claim 10, wherein the forming the material layer is carried out in a manner so that the material layer includes a plasma-enhanced silicon nitride material.

13. The method of claim 10, further including:

before the forming the material layer, forming an anti-reflective coating (ARC) layer over the back side of the device substrate.

14. The method of claim 13, wherein the forming the material layer is carried out in a manner so that the material layer has a first refractive index value that is a function of a second refractive index value of the ARC layer.

15. The method of claim 10, wherein:

the image sensor device includes a pixel region and a periphery region;

the forming the radiation-detection device is carried out in a manner so that the radiation-detection device is formed in the pixel region; and the forming the radiation-shielding component is carried out in a manner so that the radiation-shielding component is formed in the periphery region.

16. The method of claim 15, further including forming a reference pixel in the periphery region, wherein the forming the radiation-shielding component is carried out in a manner so that the radiation-shielding component substantially prevents the radiation waves from reaching the reference pixel.

17. The method of claim 10, further including:

bonding a carrier substrate to the device substrate; and thinning the device substrate from the back side.

18. The image sensor device of claim 1, wherein the material layer includes at least one of SiON and an oxide material.

19. The image sensor device of claim 8, further comprising a bonding region adjacent the periphery region that includes a bonding pad, and wherein the radiation-blocking device continuously extends from an interface between the pixel region and the periphery region to an interface between the periphery region and the bonding pad region.

20. The image sensor of claim 8, wherein the tensile stress applied by the material layer to substrate substantially offsets a compressive stress applied by the radiation-shielding component to the substrate.

* * * * *